United States Patent
Kang

(10) Patent No.: US 7,499,343 B2
(45) Date of Patent: Mar. 3, 2009

(54) DATA ALIGNMENT CIRCUIT AND ALIGNMENT METHOD FOR SEMICONDUCTOR MEMORY DEVICE

(75) Inventor: Shin Deok Kang, Kyoungki-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 0 days.

(21) Appl. No.: 11/775,458

(22) Filed: Jul. 10, 2007

(65) Prior Publication Data
US 2008/0080262 A1 Apr. 3, 2008

(30) Foreign Application Priority Data
Sep. 29, 2006 (KR) ............... 10-2006-0096623

(51) Int. Cl.
*G11C 7/00* (2006.01)
(52) U.S. Cl. .................. 365/189.05; 365/194
(58) Field of Classification Search ........ 365/193, 365/221
See application file for complete search history.

(56) References Cited

U.S. PATENT DOCUMENTS

| | | | |
|---|---|---|---|
| 6,909,643 B2 * | 6/2005 | Kwean | 365/193 |
| 7,016,237 B2 * | 3/2006 | Lee et al. | 365/189.05 |
| 7,020,031 B2 * | 3/2006 | Shin et al. | 365/193 |
| 7,304,898 B2 * | 12/2007 | Lee et al. | 365/193 |
| 2003/0086303 A1 * | 5/2003 | Jeong | 365/189.05 |

FOREIGN PATENT DOCUMENTS

| | | |
|---|---|---|
| JP | 2000-40363 A | 2/2000 |
| KR | 2000-0013219 A | 3/2000 |
| KR | 2001-0108786 A | 12/2001 |
| KR | 2002-0086197 A | 11/2002 |
| KR | 1020050101858 | 10/2005 |

OTHER PUBLICATIONS

Notice of Preliminary Rejection-Korean Intellectual Property Office Sep. 20, 2007.

* cited by examiner

*Primary Examiner*—Tan T. Nguyen
(74) *Attorney, Agent, or Firm*—Ladas & Parry LLP

(57) ABSTRACT

Data externally inputted in series are output aligned in parallel for a prefetch operation by a data alignment circuit. In the prefetch operation, sequential odd numbered data are latched in response to a rising data strobe signal and sequential even numbered data are latched in response to a falling data strobe signal. Thereafter, the data are output aligned only in response to the falling data strobe signal. The number of latch circuits is reduced. The data alignment circuit includes: a first latch unit that latches the data in response to the data strobe signal to output first and second alignment signals that are output aligned to the falling edge of the data strobe signal; and a second latch unit that latches the first and second alignment signals at the falling edge of the data strobe signal to output align third and fourth data alignment signals that are aligned to the falling edge of the data strobe signal.

38 Claims, 7 Drawing Sheets

US 7,499,343 B2

DATA ALIGNMENT CIRCUIT AND ALIGNMENT METHOD FOR SEMICONDUCTOR MEMORY DEVICE

CROSS-REFERENCE TO RELATED APPLICATIONS

The present application claims priority to Korean patent application number 10-2006-0096623 filed on Sep. 29, 2006, which is incorporated herein by reference in its entirety.

BACKGROUND OF THE INVENTION

The present invention relates to a semiconductor memory device, and more particularly, to a data alignment circuit and a data alignment method in which data externally inputted in series are aligned in parallel for a prefetch operation.

In general, a synchronous memory device performs a prefetch operation in which data are externally inputted in series are aligned in parallel by a data strobe signal so that the data can be concurrently transmitted to a memory cell.

For example, when a 4-bit prefetch operation is performed, a conventional data alignment circuit includes seven latch units 10, 20, 30, 40, 50, 60, and 70 as shown in FIG. 1. Operations thereof will now be described in detail.

First, eight data are sequentially inputted as an input signal DIN. Then, the first four data of the eight data contained in the input signal DIN are aligned respectively in series through the latch unit 10 in response to the rising edge of the rising data strobe signal RDQS.

The four data aligned through the latch unit 10 are then aligned respectively through the latch unit 20 in response to the rising edge of the falling data strobe signal FDQS. These data are then outputted by the latch unit 20 as the data alignment signal DIN_EV1.

At this time, the rising data strobe signal RDQS corresponds to the rising edge of the data strobe signal DQS. The falling data strobe signal FDQS corresponds to the falling edge of the data strobe signal DQS.

Data contained in the alignment signal DIN_EV1 are also aligned respectively in series in response to the rising edge of the rising data strobe signal RDQS through the latch unit 30. Data aligned through the latch unit 30 are then aligned respectively in series through the latch unit 40 in response to the rising edge of the falling data strobe signal FDQS. Then, these data are finally outputted as a data alignment signal DIN_EV0.

Accordingly, the data alignment signal DIN_EV1 is shifted by one clock cycle 1tCK through the two latch units 30 and 40 based upon the falling data strobe signal FDQS; therefore, the data are outputted as the data alignment signal DIN_EV0.

Meanwhile, the remaining four data contained in the eight data of the input signal DIN are aligned respectively through the latch unit 50 in response to the rising edge of the falling data strobe signal FDQS. These remaining four data of the eight data are then outputted as the data alignment signal DIN_OD1.

These data contained in the data alignment signal DIN_OD1 are also aligned respectively in series through the latch unit 60 in response to the rising edge of the rising data strobe signal RDQS. These data aligned through the latch unit 60 are then aligned respectively in series through the latch unit 70 in response to the rising edge of the falling data strobe signal FDQS. These data are then finally outputted from the latch unit 70 as the data alignment signal DIN_OD0.

Accordingly, the data alignment signal DIN_OD1 is shifted (i.e., time delayed) by one clock cycle through the two latch units 60 and 70 in response to the falling data strobe signal FDQS. The data are then outputted as the data alignment signal DIN_OD0.

As a consequence of sequentially inputting the eight data through the seven latch units 10 to 70 of the data alignment circuit of FIG. 1, the data alignment signal DIN_EV1 corresponds to the first four data out of the eight data and the data alignment signal DIN_OD1 corresponds to the remaining four data of the eight data. As a result, the data alignment signal DIN_EV0 is time shifted relative to the data alignment signal DIN_EV1 by one clock cycle. As a result the data alignment signal DIN_OD0 is shifted relative to the data alignment signal DIN_OD1 by one clock cycle.

In other words, during a 4-bit prefetch operation, the conventional data alignment circuit concurrently outputs eight data, which are sequentially inputted, by aligning the data in parallel in a 4-bit unit. To achieve this operation, the seven latch units 10 through 70 are required.

In addition, when data is aligned according to the conventional method, three latch circuits are required for a 2-bit prefetch operation, fifteen latch circuits are required for an 8-bit prefetch operation, and '2n−1' latch circuits are required for an n-bit prefetch operation (where n is an integer greater than 1).

However, a problem lies in that the number of latch circuits included in the conventional data alignment circuit rapidly increases as the number of prefetches increases when a memory chip operates in a fast operational mode. This is because the number of prefetches increases per unit time as the operational modes of the memory chip become faster.

In the conventional data alignment circuit, when the number of prefetches increases, the number of latch circuits required for data alignment is almost doubled. This leads to a problem in that a significant amount of area in the semiconductor chip layout is consumed by these latch circuits that serve the prefetch operations. Moreover, these problems may be further aggravated by high-speed operations by adversely affecting the semiconductor chip demand with increased power consumption needs.

SUMMARY OF THE INVENTION

The present invention reduces the constraints of the layout area and lowers the subsequent power consumption by maximumly decreasing the number of latch circuits that serve the prefetches operations of a semiconductor chip.

The present invention provides a data alignment circuit comprising: a first latch unit configured to latch data in response to the data strobe signal and configured to output first and second alignment signals aligned in response to the falling edge of the data strobe signal; and a second latch unit configured to latch the first and second alignment signals in response to the falling edge of the data strobe signal and configured to output third and fourth data alignment signals aligned in response to the falling edge of the data strobe signal.

The first latch unit may be configured to latch the data in response to the data strobe signal and configured to output align the first data alignment signal, in which sequentially odd numbered data of the latched data are aligned in response to the falling edge of the data strobe signal, and the second data alignment signal in which the sequentially even numbered data of the latched data are aligned in response to the falling edge of the data strobe signal.

In the construction of the data alignment circuit, the first latch unit may comprise: a first latch sub-unit configured to latch data in response to the rising edge of the data strobe signal and configured to output a data latch signal aligned in response to the rising edge of the data strobe signal; a second latch sub-unit configured to latch the data latch signal from the first latch sub-unit in response to the falling edge of the data strobe signal and configured to output align the first data alignment signal aligned in response to the falling edge of the data strobe signal; and a third latch sub-unit configured to latch the data in response to the falling edge of the data strobe signal and configured to output align the second alignment signal aligned in response to the falling edge of the data strobe signal.

In the construction of the first latch unit, the second latch sub-unit may be configured to latch the data latch signal and may be configured to output align the first data alignment signal shifted by a half of a clock cycle with respect to the data latch signal in response to the data strobe signal.

In the construction of the first latch unit, the third latch sub-unit may be configured to latch the data and may be configured to output align the second data alignment signal aligned with the first data alignment signal.

In the construction of the data alignment circuit, the second latch unit may comprise: a fourth latch sub-unit configured to latch the first data alignment signal in response to the falling edge of the data strobe signal and configured to output a third data alignment signal aligned in response to the falling edge of the data strobe signal; and a fifth latch sub-unit configured to latch the data latch signal in response to the falling edge of the second data alignment signal and configured to output a fourth data alignment signal aligned in response to the falling edge of the data strobe signal.

In the construction of the second latch unit, the fourth latch sub-unit may be configured to latch the first data alignment signal and may be configured to time shift the third data alignment signal outputted by one clock cycle with relative to the first data alignment signal based upon the data strobe signal.

In the construction of the second latch unit, the fifth latch sub-unit may be configured to latch the second data alignment signal and may be configured to shift the fourth data alignment signal outputted by one clock cycle relative to the second data alignment signal based upon the data strobe signal.

In the construction of the first and second latch units, the second to fifth latch sub-units may each be configured to exhibit a delay time corresponding to the minimum hold time required to latch a given signal when that given signal is inputted at the falling edge of the data strobe signal.

In the construction of the data alignment circuit, in the second latch unit, when a sequentially numbered i-bit prefetch (i is an integer greater than 4) is used, then 'i−4' latch sub-units may be connected in series and configured to latch signals respectively outputted from the latch sub-unit in response to the falling edge of the data strobe signal.

In the construction of the second latch unit, each of the latch sub-units may be configured to exhibit a delay time corresponding to the minimum hold time required to latch a given signal that is respectively inputted at the falling edge of the data strobe signal, and each latch sub-unit may be configured to output signal by time shifting the output by one clock cycle based upon the data strobe signal.

An embodiment of the present invention provides a data alignment circuit configured to be used in a semiconductor memory device and in which data received in series are aligned in parallel for a prefetch operation in response to a data strobe signal, comprising: a first latch unit that is configured to latch data in response to the first edge of the data strobe signal and configured to output a data latch signal aligned in response to the first edge of the data strobe signal; a second latch unit configured to latch the data latch signal in response to the second edge of the data strobe signal and configured to output at least one first data alignment signal aligned respectively in response to the second edge of the data strobe signal; and a third latch unit configured to latch the data in response to the second edge of the data strobe signal and configured to output at least one second data alignment signal aligned in response to the second edge of the data strobe signal.

In the aforementioned aspect of the present invention, the first edge of the data strobe signal may correspond to the rising edge of the data strobe signal, and the second edge of the data strobe signal may correspond to the falling edge of the data strobe signal.

In the construction of the data alignment circuit, the first latch unit may latch the data at the first edge of the data strobe signal to output a data latch signal in which the odd data of the latched data are aligned to the first edge of the data strobe signal, and the third latch unit may latch the data at the second edge of the data strobe signal to output a second data alignment signal in which the even data of the latched data are aligned to the second edge of the data strobe signal.

In the construction of the first latch unit, the second and third latch units may each include a delay time corresponding to the minimum hold time required to latch the signal inputted at the second edge of the data strobe signal.

In the construction of the data alignment circuit, the second latch unit may comprise: a first latch sub-unit configured to latch the data latch signal at the second edge of the data strobe signal so as to output align the latched data to the second edge of the data strobe signal; and at least one second latch sub-unit, each of which is configuered to latch a signal outputted from the first latch sub-unit so as to output align the latched signal to the second edge of the data strobe signal.

In the second latch unit, the first latch sub-unit may be configured to latch the data latch signal and configured to shift the data latch signal by a half clock based upon the data strobe signal.

In the second latch unit, when an i-bit prefetch (i is an integer greater than 4) is used, the second latch unit may include 'i−4' latch sub-unit connected in series, and an output signal of each latch sub-unit may be shifted by one clock based upon the data strobe signal.

In the construction of the data alignment circuit, the third latch unit may comprise: a third latch sub-unit is configured to latch the data at the second edge of the data strobe signal and configured to output align the latched data to the second edge of the data strobe signal; and at least one fourth latch sub-unit, each of which is configured to latch a signal outputted from the third latch sub-unit to output align the latched data in response to the second edge of the data strobe signal.

In the construction of the third latch unit, the third latch sub-unit may be configured to latch the data to output align the latched data such that it is synchronous to the output of the first latch sub-unit.

In addition, when an i-bit prefetch (i is an integer greater than 4) is used, the fourth latch unit may be configured to include 'i−4' latch sub-unit connected in series, and an output signal of each latch sub-unit may be configured to shift by one clock based upon the data strobe signal.

According to another aspect of the present invention, there is provided a semiconductor memory device comprising: a data buffer unit configured to buffers data externally inputted in series; a data delay unit configured to delay the data outputted from the data buffer unit to provide a data input signal; a data strobe buffer unit configured to buffer a data strobe signal externally inputted; a data strobe delay/invert unit configured to delay and to invert a signal outputted from the data strobe buffer unit to respectively provide a rising data strobe signal and a falling data strobe signal; and a data alignment circuit configured to align the data input signal in parallel in response to the rising data strobe signal and the falling data strobe signal, wherein the data alignment circuit is configured to sample the data input signal in response to the rising data strobe signal and the falling data strobe signal and to output align the sampled signal in parallel in response to the falling data strobe signal.

In the aforementioned aspect of the present invention, the data alignment circuit may comprise: a first latch unit configured to sample the data in response to the rising data strobe signal and the falling data strobe signal and configured to output first and second data alignment signals aligned to the rising edge of the falling data strobe signal; and a second latch unit configured to latch the first and second data alignment signals in response to the falling data strobe signal to respectively output third and fourth data alignment signals output aligned in response to the rising edge of the falling data strobe signal.

In the construction of the data alignment circuit, the first latch unit may be configured to sample the data in response to the rising data strobe signal and the falling data strobe signal and configured to output align the first data alignment signal, in which the sequential odd numbered data of the sampled data are aligned to the rising edge of the falling data strobe, and the second data alignment signal in which the sequential even numbered data of the sampled data are output aligned in response to the rising edge of the falling data strobe signal.

In addition, the first latch unit may comprise: a first latch sub-unit configured to latch the data in response to the rising data strobe signal and configured to output a data latch signal aligned in response to the rising edge of the rising data strobe signal; a second latch sub-unit configured to latch the data latch signal in response to the falling data strobe signal and configured to output align the first data alignment signal aligned in response to the rising edge of the rising data strobe signal; and a third latch sub-unit configured to latch the data in response to the falling data strobe signal and configured to output align the second data alignment signal aligned in response to the rising edge of the falling data strobe signal.

In the construction of the first latch unit, the second latch sub-unit may be configured to latch the data latch signal and configured to output align the first data alignment signal shifted by a half clock with respect to the data latch signal based upon the data strobe signal.

In addition, the third latch sub-unit may be configured to latch the data to output align the second data alignment signal aligned in response to the first data alignment signal.

In the construction of the data alignment circuit, the second latch unit may comprise: a fourth latch sub-unit configured to latch the first data alignment signal in response to the falling data strobe signal and configured to output align a third data alignment signal aligned in response to the rising edge of the falling data strobe signal; and a fifth latch sub-unit configured to latch the second data alignment signal in response to the falling data strobe signal and configured to output align a fourth data alignment signal aligned in response to the rising edge of the falling data strobe signal.

In the construction of the second latch unit, the fourth latch sub-unit may be configured to latch the first data alignment signal and configured to output align the third data alignment signal shifted by one clock with respect to the first data alignment signal based upon the data strobe signal.

In addition, the fifth latch sub-unit may be configured to latch the second data alignment signal to output align the fourth data alignment signal shifted by one clock with respect to the second data alignment signal based upon the data strobe signal.

In the construction of the first and second latch units, the second through fifth latch sub-unit may each be configured to display a delay time corresponding to the minimum hold time required to latch a given signal that is inputted in response to the falling data strobe signal.

In the construction of the data alignment circuit, in the second latch unit, when an i-bit prefetch (i is an integer greater than 4) is used, then 'i–4' latch sub-unit may be further connected in series so that signals respectively outputted from the latch sub-unit are latched in response to the falling data strobe signal.

In the construction of the second latch unit, each of the latch sub-unit may be configured to exihbit a delay time corresponding to the minimum hold time required to latch a given signal inputted at the falling edge of the data strobe signal, and the input signal of each latch sub-unit may be configured to shift by one clock based upon the data strobe signal.

According to another aspect of the present invention, there is provided a data alignment method comprising: a first step in which data externally inputted in series are latched at the rising edge of the data strobe signal so that the odd data of the input data are aligned to the rising edge of the data strobe signal; a second step in which the data aligned in the first step are latched at the falling edge of the data strobe signal so that the latched data are aligned to the falling edge of the data strobe signal; a third step in which the data are latched at the falling edge of the data strobe signal so that the even data of the latched data are aligned to the falling edge of the data strobe signal; and a fourth step in which the data aligned in the second and third steps are respectively latched at the falling edge of the data strobe signal according to the number of prefetches, and the latched data are then repeatedly latched at the falling edge of the data strobe signal, so as to output a plurality of data alignment signals aligned to the falling edge of the data strobe signal.

In the aforementioned aspect of the present invention, in the second step, the data latch signal is preferably latched to shift the data aligned in the first step by a half clock based upon the data strobe signal.

In addition, in the third step, the data is preferably latched so that the latched data are synchronously aligned with the data aligned in the second step.

In addition, in the fourth step, the input data may be shifted by one clock based upon the data strobe signal.

In addition, in the fourth step, when an i-bit prefetch (i is an integer greater than 4) is used, latch operations are preferably repeated 'i–4' times.

Hereinafter, embodiments of the present invention will be described in detail with reference to the accompanying drawings.

According to an embodiment of the present invention, in a prefetch operation, sequential odd numbered data are latched in response to a rising data strobe signal, and sequential even numbered data are latched in response to a falling data strobe signal. Thereafter, the data are aligned using the falling data strobe signal. Accordingly, the number of latch circuits can be reduced.

Figure 1:
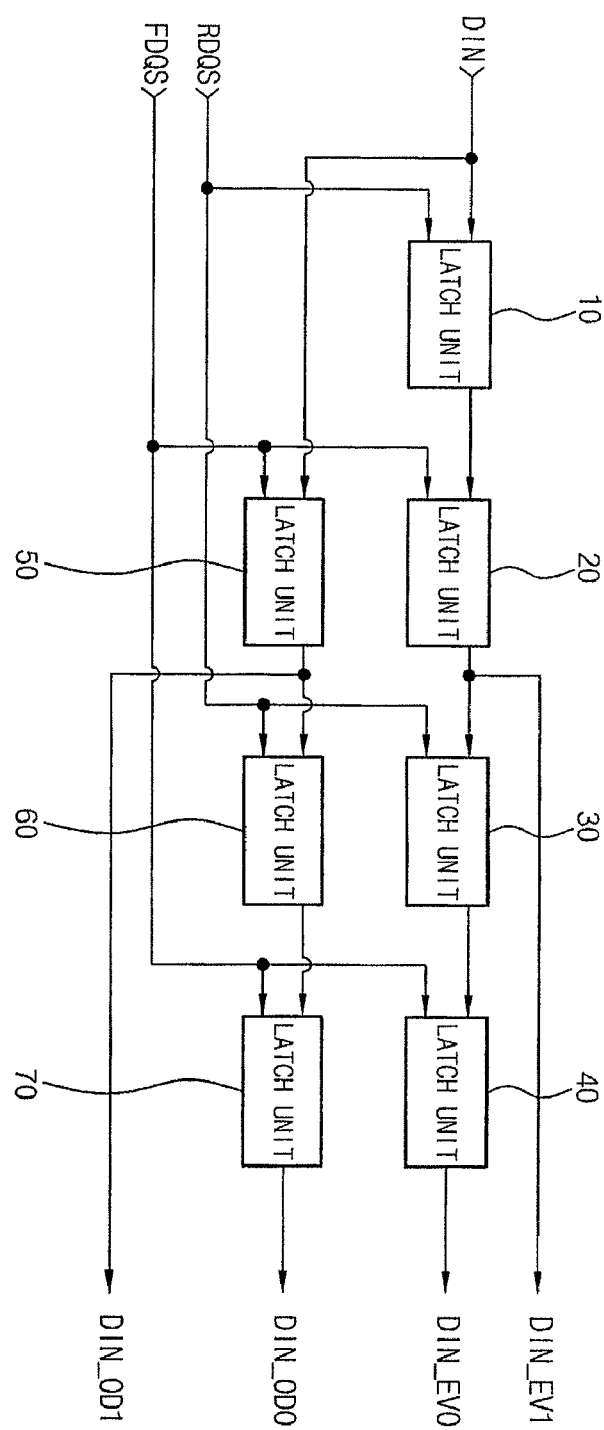
FIG. 1 is a block diagram illustrating a conventional data alignment circuit when a 4-bit prefetch is used.
Figure 2:
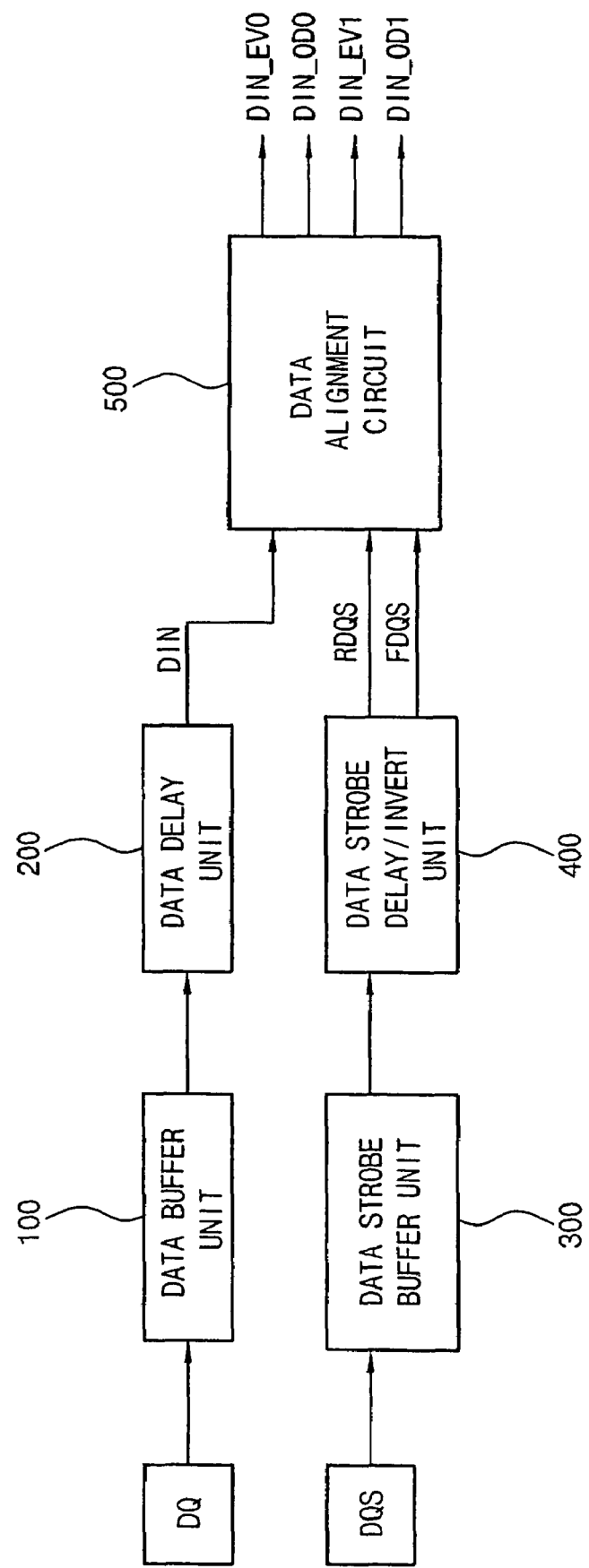
FIG. 2 is the block diagram illustrating circuits related to a prefetch operation of a semiconductor memory device according to an embodiment of the present invention.

Referring to FIG. 2, a circuit of a semiconductor memory device according to an embodiment of the present invention may include a data buffer unit 100, a data delay unit 200, a data strobe buffer unit 300, a data strobe delay/invert unit 400, and a data alignment circuit 500.

The data buffer unit 100 buffers data inputted from the data input/output pin DQ. The data delay unit 200 delays the buffered data to provide a data input signal DIN.

The data strobe buffer unit 300 buffers the data strobe signal inputted from the data strobe pin DQS. The data strobe delay/invert unit 400 delays and inverts the buffered signal to respectively provide a rising data strobe signal RDQS and a falling data strobe signal FDQS.

In this case, the data delay unit 200 and the data strobe delay/invert unit 400 respectively delay the buffered data and the buffered data strobe signal. Thus, margins of the setup time and hold time are ensured between the data input signal DIN and the rising data strobe signal RDQS and between the input signal DIN and the falling data strobe signal FDQS.

When a 4-bit prefetch is used, the data alignment circuit 500 latches the data input signal DIN in response to the rising data strobe signal RDQS and the falling data strobe signal FDQS, so that data alignment signals DIN_EV0, DIN_OD0, DIN_EV1, and DIN_OD1 are generated so as to be used to output align the 4-bit data in parallel.

Figure 3:
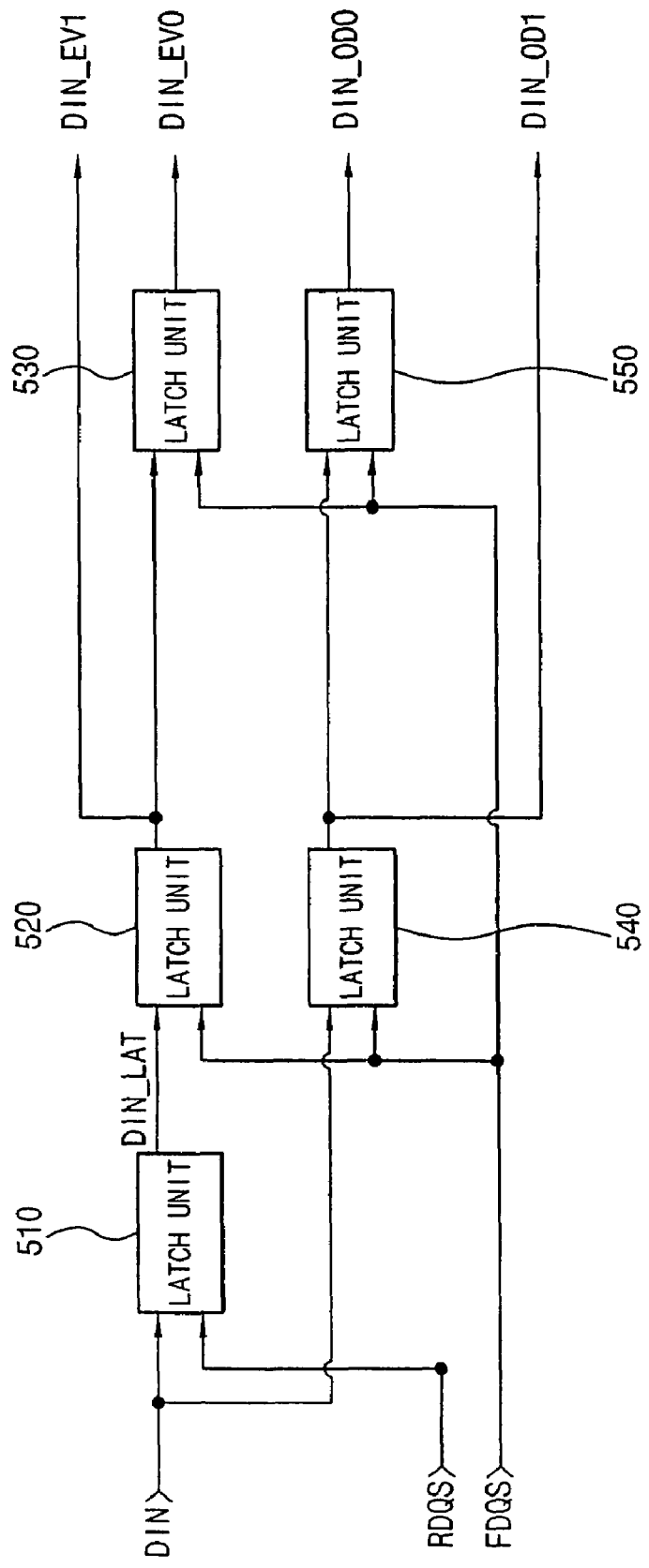
FIG. 3 is a block diagram illustrating the data alignment circuit 500 of FIG. 2.

Here, when the 4-bit prefetch is used, the data alignment circuit 500 may be constructed as shown in FIG. 3. This will now be described in detail.

Referring to FIG. 3, the data alignment circuit 500 includes five latch units 510, 520, 530, 540 and 550. The latch units 520 through 550, with the exception of latch unit 510, latch signals inputted in response to the falling data strobe signal FDQS.

Concretely, the latch unit 510 latches the data input signal DIN in response to the rising data strobe signal RDQS to output align the data latch signal DIN_LAT aligned to the rising edge of the rising data strobe signal RDQS.

The latch unit 520 latches the data latch signal DIN_LAT in response to the falling data strobe signal FDQS to output align the data alignment signal DIN_EV1 aligned to the rising edge of the falling data strobe signal FDQS.

The latch unit 530 latches the data alignment signal DIN_EV1 in response to the falling data strobe signal FDQS to output align the data alignment signal DIN_EV0 aligned to the rising edge of the falling data strobe signal FDQS.

The latch unit 540 latches the data input signal DIN in response to the falling data strobe signal FDQS to output align the data alignment signal DIN_OD1 aligned to the rising edge of the falling data strobe signal FDQS.

The latch unit 550 latches the data alignment signal DIN_OD1 in response to the falling data strobe signal FDQS to output align the data alignment signal DIN_OD0 aligned to the rising edge of the falling data strobe signal FDQS.

In the data alignment circuit 500 having this structure, each latch unit 510 through 550 may be constructed with the same circuit. For example, the latch unit 530 may be constructed as shown in FIG. 4.

Figure 4:
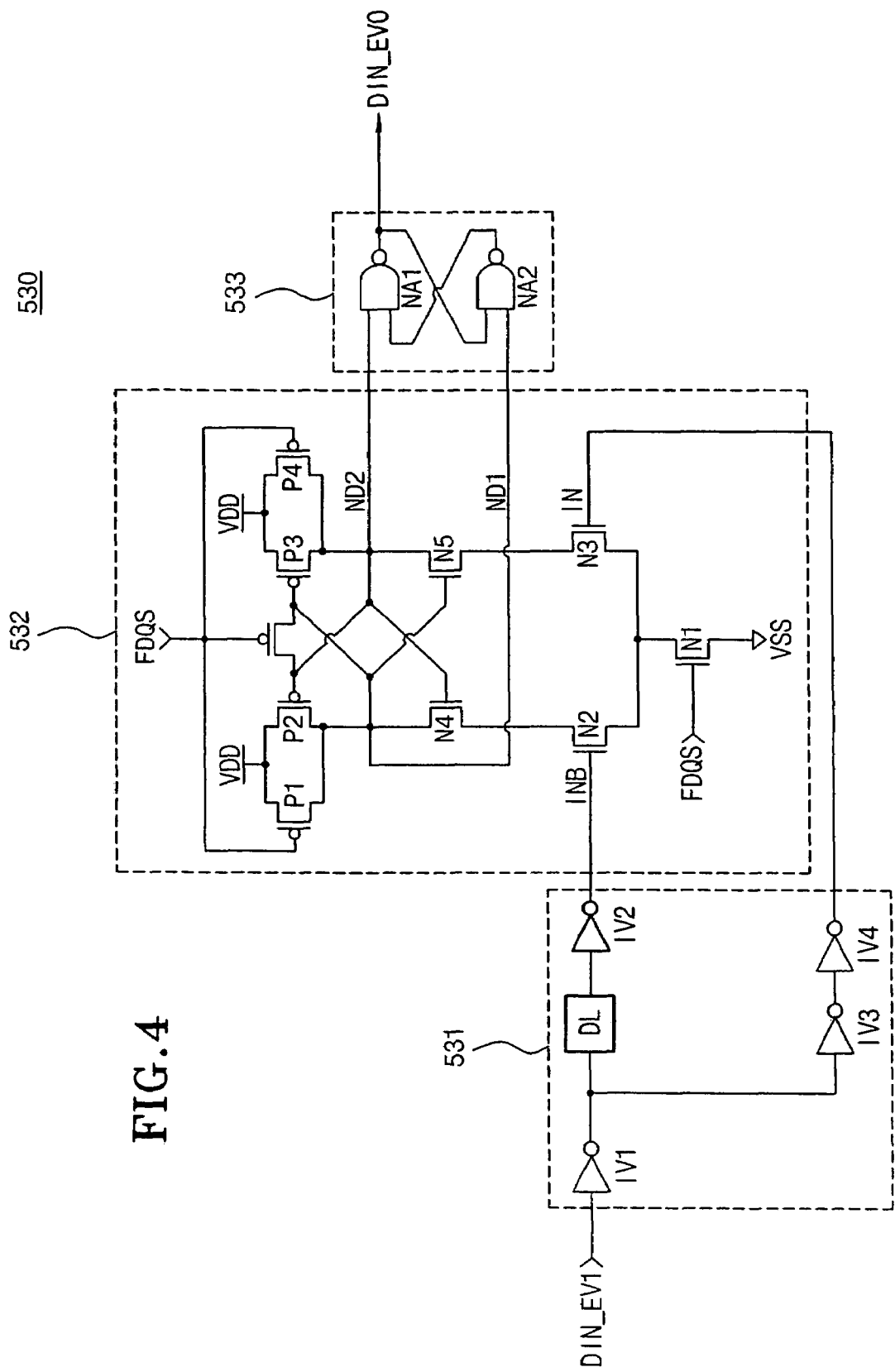
FIG. 4 is a block diagram illustrating the latch unit 530 of FIG. 3.

That is, the latch unit 530 of FIG. 4 includes an input unit 531 that delays and inverts the data alignment signal DIN_EV1 to output two input signals IN and INB, a differential amplifier unit 532 that operates when the falling data strobe signal FDQS is high so as to sense and amplify the electric potential difference between the two input signals IN and INB, and an SR latch unit 533 that latches a signal outputted from the differential amplifier unit 532 to output align the data alignment signal DIN_EV0.

The input unit 531 includes an inverter IV1 that inverts the data alignment signal DIN_EV1, a delay element DL that delays the signal outputted from the inverter IV1, an inverter IV2 that inverts the signal outputted from the delay element DL to output align the input signal INB, an inverter IV3 that inverts the signal outputted from the inverter IV1, and an inverter IV4 that inverts the signal outputted from the inverter IV3 to output align the invert input signal IN.

The delay element DL delays the input signal IN so that the input signal IN is outputted such that it is synchronous with the invert input signal INB.

The differential amplifier unit 532 includes an NMOS transistor N1 that pulls down the voltage at the common node COMM to the ground voltage VSS according to the state of the falling data strobe signal FDQS, an NMOS transistor N2 that connects an NMOS transistor N4 and the common node COMM according to the state of the invert input signal INB, an NMOS transistor N3 that connects an NMOS transistor N5 and the common node COMM according to the state of the input signal IN, the NMOS transistor N4 that connects an output node ND1 and the NMOS transistor N2 according to the state of an output node ND2, the NMOS transistor N5 that connects the output node ND2 and the NMOS transistor N3 according to the state of the output node ND1, a PMOS transistor P1 that pulls up a voltage at the output node ND1 to a power voltage VDD according to the state of the falling data strobe signal FDQS, a PMOS transistor P2 that pulls up the voltage at the output node ND1 to the power voltage VDD according to the state of the output node ND2, a PMOS transistor P3 that pulls up the voltage at the output node ND2 to the power voltage VDD according to the state of the output node ND1, a PMOS transistor P4 that pulls up the voltage at the output node ND2 to the power voltage VDD according to the state of the falling data strobe signal FDQS, and a PMOS transistor P5 that connects the output node ND1 and the output node ND2 according to the state of the falling data strobe signal FDQS.

The SR latch unit 533 includes a NAND gate NA1 through which a NAND combination of the signal transmitted to the output node ND2 and a signal outputted from the NAND gate NA2 is obtained to output align the data alignment signal DIN_EV0. Further, the SR latch unit 533 includes the NAND gate NA2 through which a NAND combination of the signal transmitted to the output node ND1 and the data alignment signal DIN_EV0 is obtained to transmit the result to the NAND gate NA1.

Now, operations performed according to an embodiment of the present invention will be described in detail with reference to FIGS. 5 and 6 when a 4-bit prefetch is used.

Figure 5:
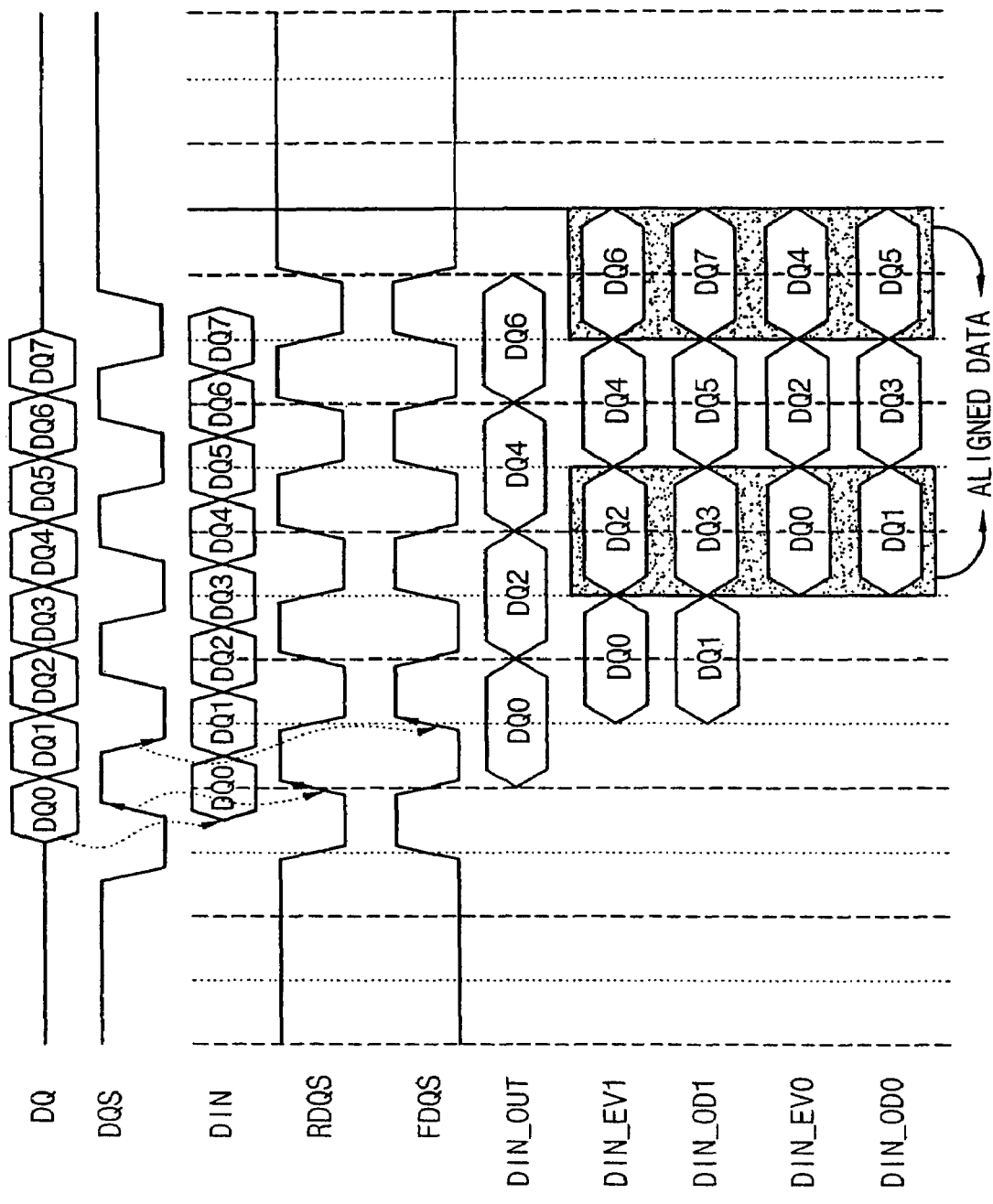
FIG. 5 is a waveform diagram explaining the prefetch operation of FIG. 2 in an ideal condition where there is no delay caused by the latch.
Figure 6:
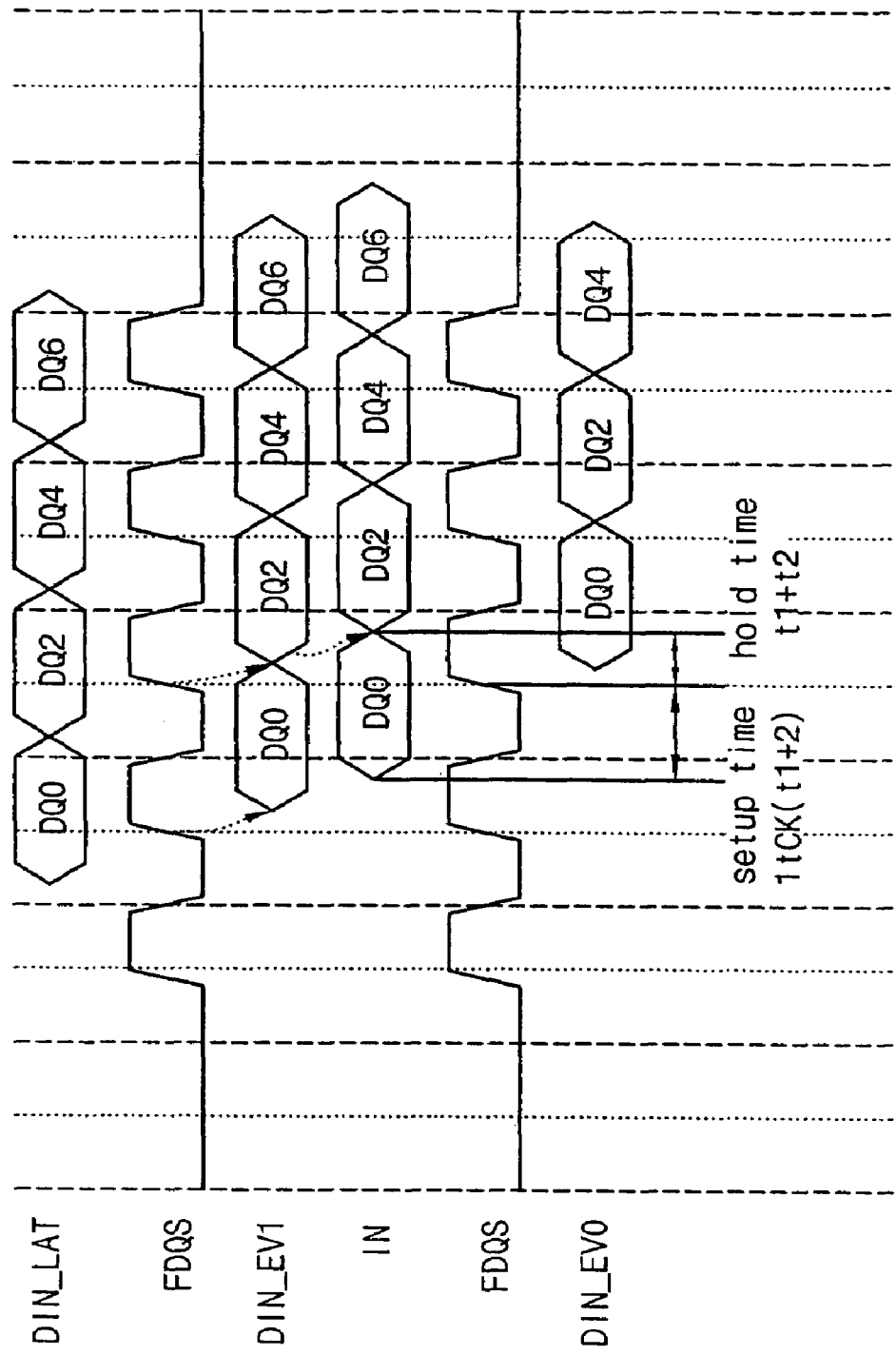
FIG. 6 is a waveform diagram explaining the data alignment operation of FIG. 3 in consideration of delays (t1, t2) caused by a latch.

Referring first to FIG. 5, data DQ0 through DQ7 are sequentially inputted from the data input/output pin DQ to output align the data input signal DIN through the data buffer unit 100 and the data delay unit 200.

The data strobe signal is inputted from the data strobe pin DQS to respectively output the rising data strobe signal RDQS and the falling data strobe signal FDQS through the data strobe buffer unit 300 and the data strobe delay/invert unit 400.

Thereafter, the data input signal DIN is sampled in response to the rising data strobe signal RDQS to output align the data latch signal DIN_LAT, which is aligned to the rising edge of the rising data strobe signal RDQS. The data latch signal DIN_LAT corresponds to the odd data DQ0, DQ2, DQ4, and DQ6 of the input data DQO to DQ7.

The data latch signal DIN_LAT is sampled in response to the falling data strobe signal FDQS to output align the data alignment signal DIN_EV1, which is aligned to the rising edge of the falling data strobe signal FDQS. That is, the data latch signal DIN_LAT is shifted by a half clock cycle through the latch unit 520.

The data alignment signal DIN_EV1 is sampled again in response to the falling data strobe signal FDQS to output align the data alignment signal DIN_EV0, which is aligned to the rising edge of the falling data strobe signal FDQS. That is, the data alignment signal DIN_EN1 is shifted by one clock through the latch unit 530.

Meanwhile, the data input signal DIN is sampled in response to the falling data strobe signal FDQS and to the output of the data alignment signal DIN_OD1, which is aligned to the rising edge of the falling data strobe signal FDQS. In this case, the data alignment signal DIN_OD1 corresponds to the even data DQ1, DQ3, DQ5, DQ7 of the input DQ0 to DQ7.

The data alignment signal DIN_OD1 is sampled again in response to the falling data strobe signal FDQS to output align the data alignment signal DIN_OD0, which is aligned to the rising edge of the falling data strobe signal FDQS. That is, the data alignment signal DIN_OD1 is shifted by one clock through the latch unit 550.

In the operations according to an embodiment of the present invention, a setup time and a hold time have to be sufficiently ensured when the two data alignment signals DIN_EV1 and DIN_OD1 are respectively inputted and latched to the latch units 530 and 550, so that the data alignment signals DIN_EV1 and DIN_OD1 can be properly aligned to the data alignment signals DIN_EV0 and DIN_OD0.

This will be described with reference to FIG. 6. The data latch signal DIN_LAT is shifted by a half clock in response to the falling data strobe signal FDQS, thereby becoming the data alignment signal DIN_EV1.

In this case, the data latch signal DIN_LAT is further delayed by the latch time of the latch unit 520, that is, the latch time t1 of the SR latch unit 533 of FIG. 4, to output align the data alignment signal DIN_EV1.

When the data alignment signal DIN_EV1 is inputted to the latch unit 530, the data alignment signal DIN_EV1 is delayed by the time t2 through the input unit 531 of FIG. 4, thereby generating the input signal IN. Thereafter, the input signal IN is aligned to the rising edge of the falling data strobe signal FDQS through the differential amplifier unit 532 and the SR latch unit 533.

That is, in the latch unit 530, a setup time and a hold time between the input signal IN and the falling data strobe signal FDQS are 1tCK−(t1+t2) and t1+t2, respectively.

The hold time of t1+t2 according to an embodiment of the present invention may be sufficient as a time for shifting and aligning data. If the hold time is not sufficiently long, in order to regulate the hold time, an engineer may regulate sizes of the inverters IV1 to IV4 of the input unit 531 and sizes of the NAND gates NA1, NA2 of the SR latch unit 533.

According to an embodiment of the present invention, even when data are sampled in response to the falling data strobe signal FDQS through the latch units 520 and 540 and then aligned in response to the falling data strobe signal FDQS, the prefetch operation can be properly performed. As a result, when the 4-bit prefetch is used, the number of latch circuits is reduced by 2 in comparison with the conventional case.

Similarly to the case of 4-bit prefetch, this embodiment of the present invention can apply to all n-bit prefetch operations. For example, an 8-bit prefetch may be constructed as the circuit of FIG. 7.

Figure 7:
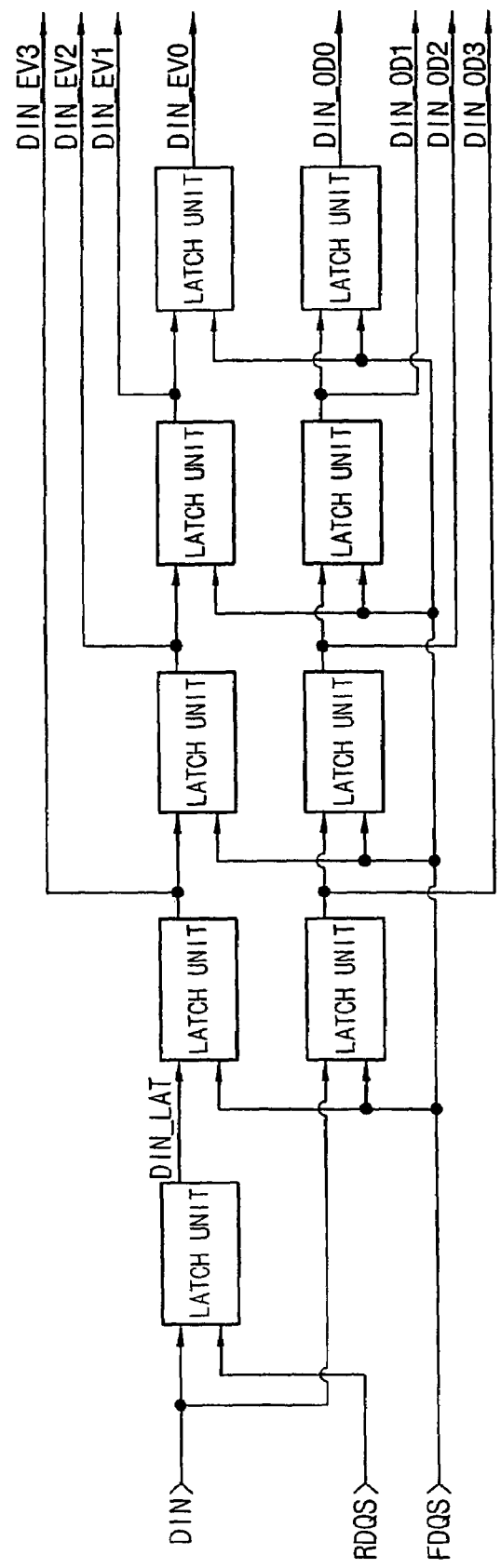
FIG. 7 is a block diagram illustrating a data alignment circuit according to an embodiment of the present invention when an 8-bit prefetch is used.

That is, as shown in FIG. 7, in this embodiment of the present invention, as in the case of 4-bit prefetch, data sampled in response to the falling data strobe signal FDQS are aligned to the data alignment signals DIN_EV0 to DIN_EV3 and DIN_OD0 to DIN_OD3 in response to the falling data strobe signal FDQS.

When the 8-bit prefetch is used in this embodiment of the present invention, nine latch circuits may be included. In this case, the number of latch circuits is reduced by six in comparison with the convention case. That is, in this embodiment of the present invention, if an n-bit prefetch is used, the number of latch circuits can be reduced by 'n−2' in comparison with the conventional case.

According to the present invention, initial input data are sampled in response to a rising data strobe signal, and thereafter the data are aligned only in response to a falling data strobe signal in a latch operation. Therefore, in terms of the as an increase in the number of prefetches during high-speed operation alos increases the area of the data alignment circuit and power consumption, there is an advantage to the present invention in that the area of layout and power consumption can be further reduced than that of the conventional method.

While the present invention has been particularly shown and described with reference to exemplary embodiments thereof, it will be understood by those skilled in the art that various changes in form and details may be made therein without departing from the spirit and scope of the present invention as defined by the appended claims.

What is claimed is:

1. A data alignment circuit comprising:
    a first latch unit configured to latch a inputted data in response to a data strobe signal and configured to output first and second alignment signals in response to a falling edge of the data strobe signal; and
    a second latch unit configured to latch the first and second alignment signals in response to the falling edge of the data strobe signal and configured to output third and fourth data alignment signals aligned in response to the falling edge of the data strobe signal.

2. The data alignment circuit of claim 1, wherein the first latch unit is configured to latch the inputted data in response to the data strobe signal and configured to output align the first data alignment signal, in which sequential odd numbered data of the latched inputted data are aligned in response to the falling edge of the data strobe signal, and the first latch unit is configured to latch the input data in response to the data strobe signal and configured to output align the second data alignment signal in which sequential even numbered data of the latched inputted data are aligned in response to the falling edge of the data strobe signal.

3. The data alignment circuit of claim 2, wherein the first latch unit comprises:
a first latch sub-unit configured to latch the inputted data in response to the rising edge of the data strobe signal and configured to output a data latch signal aligned in response to the rising edge of the data strobe signal;
a second latch sub-unit configured to latch the data latch signal in response to the falling edge of the data strobe signal and configured to output align the first data alignment signal aligned in response to the falling edge of the data strobe signal; and
a third latch sub-unit configured to latch the inputted data in response to the falling edge of the data strobe signal and configured to output align the second alignment signal aligned in response to the falling edge of the data strobe signal.

4. The data alignment circuit of claim 3, wherein the second latch sub-unit is configured to latch the data latch signal and configured to delay the first data alignment signal outputted by a half clock cycle relative to the data latch signal based upon the data strobe signal.

5. The data alignment circuit of claim 3, wherein the third latch sub-unit is configured to latch data and configured to output align the second data alignment signal aligned in response to the first data alignment signal.

6. The data alignment circuit of claim 1, wherein the second latch unit comprises:
a fourth latch sub-unit configured to latch the first data alignment signal in response to the falling edge of the data strobe signal and configured to output a third data alignment signal aligned in response to the falling edge of the data strobe signal; and
a fifth latch sub-unit configured to latch the data latch signal in response to the falling edge of the second data alignment signal and configured to output a fourth data alignment signal aligned in response to the falling edge of the data strobe signal.

7. The data alignment circuit of claim 6, wherein the fourth latch sub-unit configured to latch the first data alignment signal and configured to output align the third data alignment signal shifted by one clock cycle relative to the first data alignment signal based upon the data strobe signal.

8. The data alignment circuit of claim 6, wherein the fifth latch sub-unit configured to latch the second data alignment signal and configured to output align the fourth data alignment signal shifted by one clock cycle relative to the second data alignment signal based upon the data strobe signal.

9. The data alignment circuit of claim 3 or 6, wherein the second, third, fourth, and fifth latch sub-units are each configured to exhibit a delay time corresponding to a minimum hold time required to latch a given signal that is respectively inputted in response to the falling edge of the data strobe signal.

10. The data alignment circuit of claim 6, wherein, in the second latch unit, when an i-bit prefetch (where i is an integer greater than 4) is used, then 'i-4' latch sub-units are connected in series to latch signals respectively outputted from the latch sub-units in response to the falling edge of the data strobe signal.

11. The data alignment circuit of claim 10, wherein each latch sub-unit is configured to exhibit a delay time corresponding to a minimum hold time required to latch a given signal that is inputted in response to the falling edge of the data strobe signal, and each latch sub-unit is configured to output an output signal shifted by one clock cycle based upon the data strobe signal.

12. A data alignment circuit comprising:
a first latch unit configured to latch a input data in response to a first edge of a data strobe signal and configured to output a data latch signal aligned in response to the first edge of the data strobe signal;
a second latch unit configured to latch the outputted data latch signal in response to a second edge of the data strobe signal and configured to output at least one first data alignment signal respectively output aligned in response to the second edge of the data strobe signal; and
a third latch unit configured to latch data in response to the second edge of the data strobe signal and configured to output at least one second data alignment signal respectively output aligned in response to the second edge of the data strobe signal.

13. The data alignment circuit of claim 12, wherein the first edge of the data strobe signal is a rising edge of the data strobe signal, and the second edge of the data strobe signal is a falling edge of the data strobe signal.

14. The data alignment circuit of claim 12, wherein the first latch unit is configured to latch data in response to the first edge of the data strobe signal and configured to output a data latch signal in which the sequential odd numbered data of the latched data are outputted in response to the first edge of the data strobe signal, and the third latch unit is configured to latch the sequential odd numbered data at the second edge of the data strobe signal and the third latch is configured to output a second data alignment signal in which sequential even numbered data of the latched data are outputted in response to the second edge of the data strobe signal.

15. The data alignment circuit of claim 12, wherein the second and third latch units are both configured to exhibit a delay time corresponding to a minimum hold time required to latch a given signal inputted in response to the second edge of the data strobe signal.

16. The data alignment circuit of claim 15, wherein the second latch unit comprises:
a first latch sub-unit configured to latch the data latch signal in response to the second edge of the data strobe signal so as to output align the latched data in response to the second edge of the data strobe signal; and
at least one latch sub-unit, each latch sub-unit is configured to latch a signal outputted from the first latch sub-unit so as to output align respectively the latched signal in response to the second edge of the data strobe signal.

17. The data alignment circuit of claim 16, wherein the first latch sub-unit is configured to latch the data latch signal and configured to time delay output of the data latch signal by a half of a clock cycle based upon to the data strobe signal.

18. The data alignment circuit according to claim 16, wherein, when an i-bit prefetch (i is an integer greater than 4) is used, then the second latch unit includes 'i-4' latch sub-units connected in series, and each latch sub-unit is configured to shift the output signal by one clock cycle based upon the data strobe signal.

19. The data alignment circuit of claim 15, wherein the third latch unit comprises:
a third latch sub-unit configured to latch data in response to the second edge of the data strobe signal to output align the latched data in response to the second edge of the data strobe signal; and
at least one fourth latch sub-unit, each fourth latch sub-unit configured to latch a signal outputted from the third latch sub-unit and to respectively output align the latched data in response to the second edge of the data strobe signal.

20. The data alignment circuit of claim 16 or 19, wherein the third latch sub-unit is configured to latch data and configured to output align the latched data in synchronous with an output of the first latch sub-unit.

21. The data alignment circuit according to claim 19, wherein, when an i-bit prefetch (i is an interger greater than 4) is used, then the fourth latch unit is configured to include 'i-4' latch sub-units connected in series, and each latch sub-unit is configured to output align by one clock cycle based upon the data strobe signal.

22. A semiconductor memory device comprising:
a data buffer unit configured to buffer data externally inputted in series to the data buffer unit;
a data delay unit operatively connected to the data buffer, the data delay unit configured to provide a data input signal by delaying data outputted from the data buffer;
a data strobe buffer unit configured to buffer a data strobe signal externally inputted to the data strobe buffer;
a data strobe delay/invert unit operatively connected to the data strobe buffer unit, the data strobe delay/invert unit configured to delay and to invert a signal outputted from the data strobe buffer unit to the data strobe delay/invert unit and configured to respectively provide a rising data strobe signal and a falling data strobe signal; and
a data alignment circuit operatively connected to the data delay unit and operatively connected to the data strobe delay/invert unit, the data alignment circuit configured to output align the data input signal in parallel in response to the rising and falling data strobe signals,
wherein the data alignment circuit is configured to sample the data input signal in response to the rising and data strobe signals and is configured to output align the sampled signal in parallel in response to the falling data strobe signal.

23. The semiconductor memory device of claim 22, wherein the data alignment circuit comprises:
a first latch unit configured to sample data in response to the rising and falling data strobe signals and configured to output first and second data alignment signals aligned in response to the rising edge of the falling data strobe signal; and
a second latch unit configured to respectively latch the first and second data alignment signals in response to the falling data strobe signal and configured to respectively output third and fourth data alignment signals aligned in response to the rising edge of the falling data strobe signal.

24. The semiconductor memory device of claim 23, wherein the first latch unit is configured to sample data in response to the rising and falling data strobe signals and configured to output align the first data alignment signal, in which sequential odd numbered data of the sampled data are aligned in response to the rising edge of the falling data strobe, and the second data alignment signal and in which sequential even numbered data of the sampled data are aligned in response to the rising edge of the falling data strobe signal.

25. The semiconductor memory device according to claim 24, wherein the first latch comprises:
a first latch sub-unit configured to latch data in response to the rising data strobe signal and configured to output a data latch signal aligned in response to the rising edge of the rising data strobe signal;
a second latch sub-unit configured to latch the data latch signal in response to the falling data strobe signal and configured to output align the first data alignment signal aligned in response to the rising edge of the rising data strobe signal; and
a third latch sub-unit configured to latch data in response to the falling data strobe signal and configured to output align the second data alignment signal aligned in response to the rising edge of the falling data strobe signal.

26. The semiconductor memory device of claim 25, wherein the second latch sub-unit is configured to latch the data latch signal and configured to output align the first data alignment signal shifted by a half clock cycle with respect to the data latch signal based upon the data strobe signal.

27. The semiconductor memory device of claim 26, wherein the third latch sub-unit is configured to latch the data and configured to output align the second data alignment signal aligned to a substantially similar timing position of the first data alignment signal.

28. The semiconductor memory device of claim 23, wherein, in the second latch unit is configured so that when an i-bit prefetch (i is an integer greater than 4) is used then 'i-4' latch sub-units are operatively connected in series so that signals respectively outputted from the 'i-4' latch sub-units are latched in response to the falling data strobe signal.

29. The semiconductor memory device of claim 28, wherein each 'i-4' latch sub-unit is configured to exhibit a delay time corresponding to a minimum hold time required to latch a signal inputted at the falling edge of the data strobe signal, and each 'i-4' latch sub-unit is configured to delay an output by one clock cycle based upon the data strobe signal.

30. The semiconductor memory device of claim 22, wherein the second latch unit comprises:
a fourth latch sub-unit configured to latch the first data alignment signal in response to the falling data strobe signal and configured to output a third data alignment signal aligned in response to the rising edge of the falling data strobe signal; and
a fifth latch sub-unit configured to latch the second data alignment signal in response to the falling data strobe signal and configured to output a fourth data alignment signal aligned in response to the rising edge of the falling data strobe signal.

31. The semiconductor memory device of claim 30, wherein the fourth latch sub-unit is configured to latch the first data alignment signal and configured to output align the third data alignment signal by delaying the output of the third data alignment signal by one clock cycle with respect to the first data alignment signal based upon the data strobe signal.

32. The semiconductor memory device of claim 30, wherein the fifth latch sub-unit is configured to latch the second data alignment signal and configured to output align the fourth data alignment signal by delaying the output of the fourth data alignment signal by one clock cycle with respect to the second data alignment signal based upon the data strobe signal.

33. The semiconductor memory device of claim 25 or 30, wherein each of the second to fifth latch sub-units are configured to exhibit a delay time corresponding to a minimum hold time required to latch a given signal that is inputted in response to the falling data strobe signal.

34. A data alignment method comprising:
first latching with a first latch unit a sequential odd numbered data of serial inputted data at a rising edge of a data strobe signal so that the sequential odd numbered data are output aligned in response to the rising edge of the data strobe signal;

second latching with a second latch unit the sequential odd numbered data at a falling edge of the data strobe signal so that the latched sequential odd numbered data are output aligned in response to the falling edge of the data strobe signal;

third latching with a third latch unit a sequential even number of data of serial imputted data at the falling edge of the data strobe signal so that the sequential even numbered data are output aligned in response to the falling edge of the data strobe signal; and a fourth latching with a fourth latch unit the sequential even number data at the falling edge of the data strobe signal in accordance with a number of prefetches, and then the latched sequential even numbered data are repeatedly latched with a plurality of latch sub-units in response to the falling edge of the data strobe signal, is aligned in response to the falling edge of the data strobe signal.

35. The data alignment method of claim 34, wherein the second latching step comprises latching the sequential odd numbered data latch signal to output align a delay of the sequential odd numbered data so that output of the sequential odd numbered data from the second latching step is delayed by a half clock cycle based upon the data strobe signal.

36. The data alignment method of claim 35, wherein the third latching step comprises latching the sequential even numbered data of the serial input data so that the output of sequential even numbered data from the third latching step is synchronously aligned with the output of the sequential odd numbered data from the second latching step.

37. The data alignment method of claim 34, wherein in the fourth latching step, the input sequential numbered even data output from the fourth latch is shifted by one clock cycle based upon the data strobe signal.

38. The data alignment method of claim 34, wherein in the fourth latching step, when an i-bit prefetch (i is an integer greater than 4) is used, the latch operations of the plurality of latch sub-units comprises 'i-4' latch sub-units.

* * * * *